United States Patent
Chen

[11] Patent Number: 6,133,145
[45] Date of Patent: Oct. 17, 2000

[54] METHOD TO INCREASE THE ETCH RATE SELECTIVITY BETWEEN METAL AND PHOTORESIST VIA USE OF A PLASMA TREATMENT

[75] Inventor: Chao-Cheng Chen, Matou, Taiwan

[73] Assignee: Taiwan Semiconductor Manufacturing Company, Hsin-Chu, Taiwan

[21] Appl. No.: 09/169,434

[22] Filed: Oct. 9, 1998

[51] Int. Cl.[7] ................................. H01L 21/4763
[52] U.S. Cl. .................. 438/636; 438/637; 438/638; 438/643; 438/648; 438/718; 438/720
[58] Field of Search ................... 438/636, 638, 438/643, 648, 685, 637, 718, 720, 725

[56] References Cited

U.S. PATENT DOCUMENTS

| | | | |
|---|---|---|---|
| 5,231,051 | 7/1993 | Baldi et al. | 437/187 |
| 5,609,775 | 3/1997 | Liu | 216/77 |
| 5,639,692 | 6/1997 | Teong | 438/624 |
| 5,688,719 | 11/1997 | Tsai et al. | 437/194 |
| 5,705,428 | 1/1998 | Liu et al. | 438/643 |
| 5,726,102 | 3/1998 | Lo | 438/718 |
| 5,801,096 | 9/1998 | Lee et al. | 438/636 |
| 5,904,559 | 5/1999 | Yu | 438/638 |
| 5,956,594 | 9/1999 | Yang et al. | 438/396 |

*Primary Examiner*—David Nelms
*Assistant Examiner*—Reneé R. Berry
*Attorney, Agent, or Firm*—George O. Saile; Stephen B. Ackerman

[57] ABSTRACT

A process for fabricating an aluminum based interconnect structure, using a plasma treated photoresist shape as an etch mask, has been developed. The process features treating a photoresist shape, to be used as an etch mask during RIE patterning procedures, in a nitrogen containing plasma. The plasma nitrogen treated photoresist shape is eroded at a decreased rate, when compared to counterpart non-treated photoresist shapes, during the RIE procedure used to fabricate the aluminum based interconnect structure. The increased etch rate ratio, between layers used for the interconnect structure, and the plasma treated photoresist shape, allows thinner photoresist shapes to be used, and therefore allows narrower lines and spaces to be achieved.

26 Claims, 3 Drawing Sheets

METHOD TO INCREASE THE ETCH RATE SELECTIVITY BETWEEN METAL AND PHOTORESIST VIA USE OF A PLASMA TREATMENT

BACKGROUND OF THE INVENTION (1) Field of the Invention

The present invention relates to processes used to fabricate semiconductor devices, and more specifically to a process used to define metal structures, via dry etching procedures, using photoresist shapes as an etch mask.

(2) Description of Prior Art

As the density of semiconductor chips increase, the width of metal interconnect structures have to be decreased. The critical dimensions of specific chip features, such as metal interconnect structures, are usually defined via dry etching procedures, using photoresist shapes as an etch mask. However, as the width of specific chip features, such as metal interconnect structures, decrease, the thickness of the defining photoresist shape also has to be decreased. The decreasing thickness for the defining photoresist shapes, makes it imperative that the etch selectivity, or etch rate ratio, between the metal being patterned, and the defining photoresist layer, remain high.

This invention will describe a process for defining narrow width, metal structures, for advanced semiconductor devices, via a dry etching procedure, using a photoresist shape as an etch mask. However this invention will describe a plasma treatment, in a nitrogen containing ambient, applied to the photoresist shape, prior to the metal etch cycle. The plasma treatment of the photoresist shape, slows the removal rate, of the photoresist shape, in a specific etchant, while maintaining the desired removal rate of the exposed metal. The increased etch rate selectivity allows thinner photoresist shapes, and thus narrower metal lines, to be realized. Prior art, such as Tsai et al, in U.S. Pat. No. 5,688,719, use a hydrogen containing plasma to harden the defining photoresist shape, prior to metal patterning, while Lo, in U.S. Pat. No. 5,726,102, uses an oxygen, or a nitrogen—oxygen ambient for treated defining photoresist shapes. However this invention, using only a nitrogen containing plasma, for treatment of photoresist shapes, offers the desired etch rate selectivity, between metal and photoresist, needed for definition of the narrow width, metal structures, used in advanced semiconductor devices.

SUMMARY OF THE INVENTION

It is an object of this invention to form a metal interconnect structure, for a semiconductor device, via a dry etching procedure, using a photoresist shape as an etch mask.

It is another object of this invention to treat the defining photoresist shape, in an nitrogen containing plasma, prior to the patterning of an anti-reflective coating, (ARC), located overlying a metal layer, followed by the in situ patterning of the ARC layer, and of the underlying metal layer, using the nitrogen treated photoresist shape as an etch mask.

It is yet another object of this invention to first pattern an ARC layer, located overlying a metal layer, followed by an in situ treatment of the masking photoresist shape, in a nitrogen containing plasma, then using the treated photoresist shape as an etch mask for in situ definition of the desired pattern in the underlying metal layer.

In accordance with the present invention a method for increasing the etch rate ratio of metal to masking photoresist, via use of a plasma treatment, applied to the masking photoresist shape, performed in a nitrogen ambient, resulting in a decrease of the photoresist removal rate, during the metal patterning procedure, has been developed. A first iteration of this invention entails the deposition of a composite metal layer, comprised of an underlying, titanium adhesive layer, a titanium nitride barrier layer, an aluminum based metal layer, and an overlying titanium nitride, ARC layer, on a insulator layer, and on the top surface of a conductive semiconductor element, either exposed at the bottom of an opening, in the insulator layer, or located directly on the top surface of the insulator layer. A photoresist shape is formed and then subjected to a plasma treatment, in a nitrogen containing ambient, to reduce the removal rate of the photoresist shape, in ambients used with subsequent in situ, dry etching procedures. The plasma treated, photoresist shape is then used as a mask to allow the in situ patterning of the overlying titanium nitride ARC layer, the aluminum based metal layer, the titanium nitride barrier layer, and the underlying titanium adhesive layer, to be accomplished.

A second iteration of this invention involves the use of an untreated photoresist shape, as a mask for patterning of an overlying, titanium nitride layer, followed by the plasma treatment, of the photoresist shape, in an nitrogen containing ambient. The plasma treated photoresist shape is then used as the etch mask, allowing patterning of the aluminum based metal layer, the titanium nitride barrier layer, and of the titanium layer, to be accomplished.

BRIEF DESCRIPTION OF THE DRAWINGS

The object and other advantages of this invention are best described in the preferred embodiments, with reference to the attached drawings that include.

DESCRIPTION OF THE PREFERRED EMBODIMENTS

Figure 1:
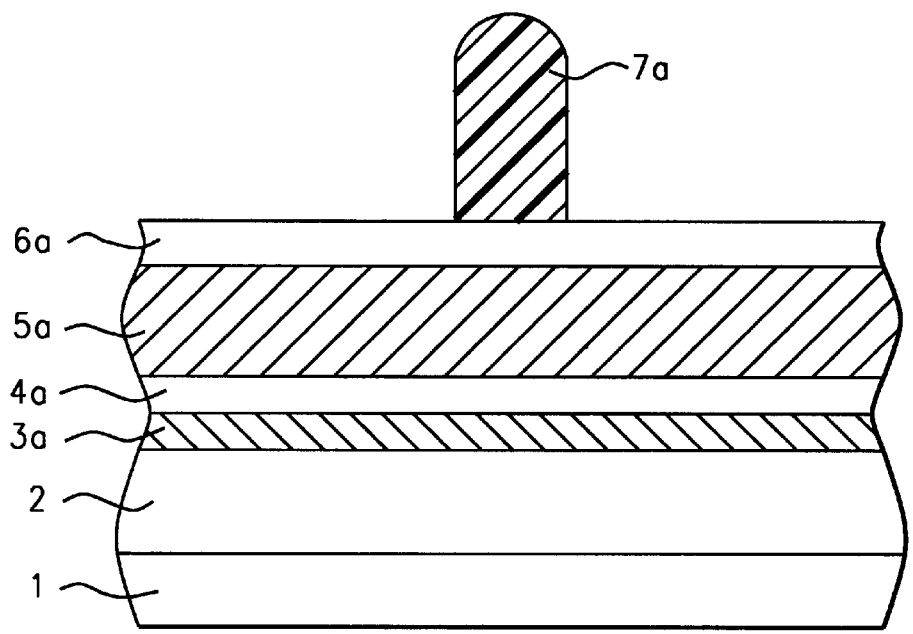
FIGS. 1–3, which schematically, in cross-sectional style, describe a procedure for patterning an aluminum based layer, without the procedure, taught in this invention, of plasma treating the masking photoresist shape, in a nitrogen containing ambient, prior to the dry etching of the exposed aluminum based metal layer.

The method of increasing the etch rate ratio between metal and an overlying masking photoresist shape, via a plasma treatment to the masking photoresist shape, performed in a nitrogen containing ambient, will now be described in detail. A P type, semiconductor substrate 1, comprised of single crystalline silicon, featuring a <100> crystallographic orientation, is used and schematically shown in FIG. 1. An insulator layer 2, such as silicon oxide, is formed on semiconductor substrate 1, at a thickness between about 1000 to 10000 Angstroms, via thermal oxidation, or via either low pressure chemical vapor deposition, (LPCVD), or plasma enhanced chemical vapor deposition, (PECVD), procedures. Openings in insulator layer 2, exposing conductive regions in semiconductor substrate 1, (not shown in the drawings), may be accomplished via conventional photolithographic, and reactive ion etching, (RIE), procedures.

After removal of the photoresist shape, used to define the openings in insulator layer 2, via plasma oxygen ashing and careful wet cleans, a titanium layer 3a, is deposited via R.F. sputtering procedures, to a thickness between about 250 to 500 Angstroms. Titanium layer 3a, used as an adhesive layer, is deposited on the top surface of insulator layer 2, as well as on the conductive regions in semiconductor substrate 1, exposed in the opening in insulator layer 2. A first titanium nitride layer 4a, is next deposited, in situ, via R.F. sputtering, to a thickness between about 250 to 1000 Angstroms. First titanium nitride layer 4a, is used as a barrier layer, protecting insulator layer 2, as well as the conductive regions, in the openings in insulator 2, from possible reaction resulting from subsequent overlying metal layers, such as aluminum. An aluminum based metal layer 5a, is next in situ deposited, via R.F. sputtering, to a thickness between about 3000 to 10000 Angstroms, with aluminum based metal layer 5a, comprised with between about 0.5 to 1.0 weight percent copper. Finally a second titanium nitride layer 6a, is in situ deposited, again via R.F. sputtering procedures, to a thickness between about 250 to 1000 Angstroms. Second titanium nitride layer 6a, is used as an anti-reflective layer, during subsequent photoresist exposure procedures. The result of these depositions is schematically shown in FIG. 1. A photoresist shape 7a, also shown schematically in FIG. 1, is formed, at a thickness between about 6500 to 15000 Angstroms, with a width between about 2000 to 5000 Angstroms, to be used as an etch mask, to define the desired pattern in the composite metal layer, using dry etching procedures.

Figure 2:
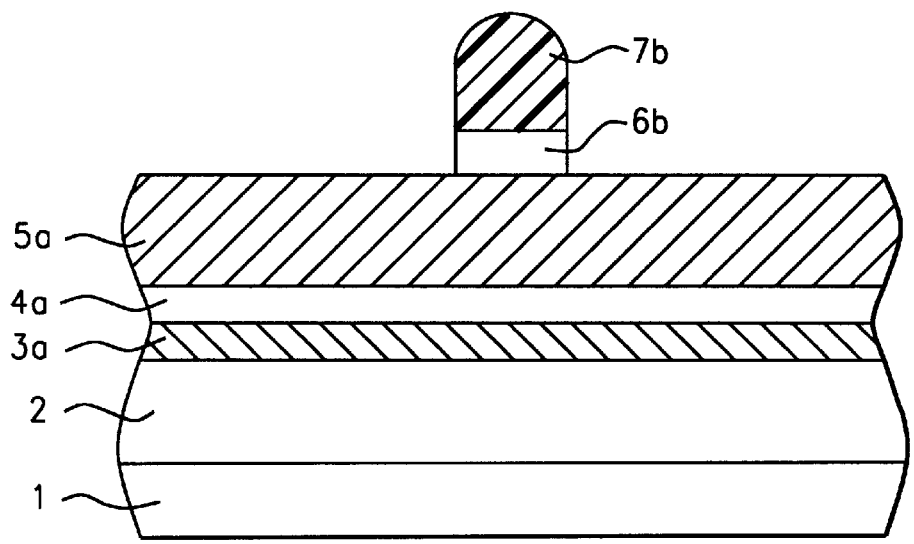
Figure 3:
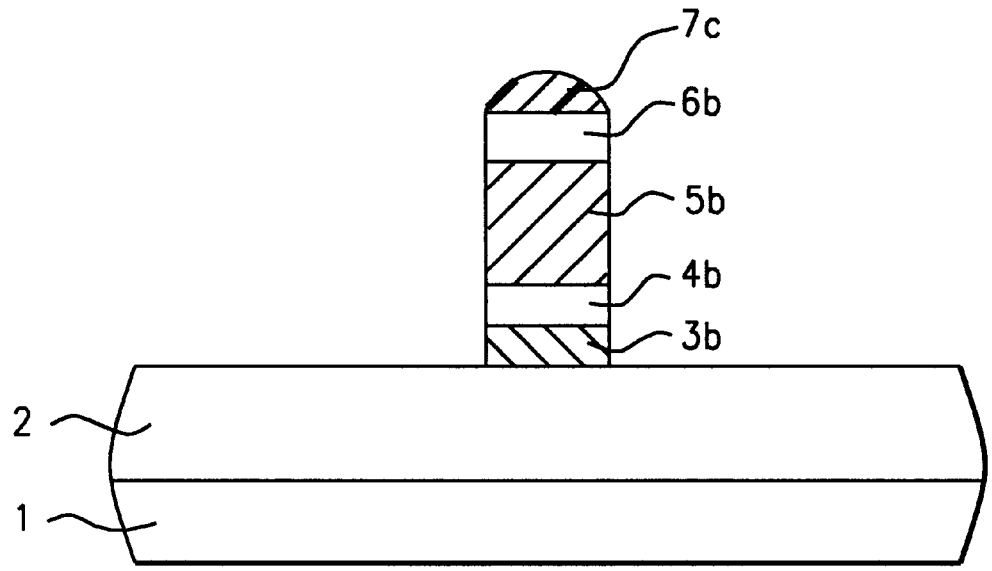

FIG. 2, schematically shows the result of removing the exposed portions of second titanium nitride layer 6a, not protected by photoresist shape 7a, via a RIE procedure, using a $Cl_2$—$BCl_3$ chemistry, as an etchant. This cycle of the patterning procedure results in the creation of second titanium nitride shape 6b, underlying photoresist shape 7b, now at a thickness between about 6000 to 20000 Angstroms, with the decreased thickness of photoresist shape 7b, in regards to photoresist shape 7a, resulting from exposure to the RIE procedure. The second cycle, of the patterning procedure, or the main etch cycle, performed in situ, again using $Cl_2$—$BCl_3$ as an etchant, results in the removal of exposed regions of aluminum based metal layer 5a, first titanium nitride layer 4a, and titanium layer 3a, creating the composite metal interconnect structure, shown schematically in FIG. 3, comprised of: second titanium nitride shape 6b; aluminum based metal shape 5b; first titanium nitride shape 4b; and titanium shape 3b; underlying thinned photoresist shape 7c. The exposure of masking photoresist shape 7b, to the second cycle of the RIE procedure, resulted in a thinned photoresist shape 7c, now only between about 1000 to 10000 Angstroms in thickness. (The amount of the thinning of photoresist is dependent on the thickness of the metal being patterned. The 1000 to 10000 Angstrom result is for a metal layer of about 4500 Angstroms. If a thicker metal layer was being patterned, photoresist thinning would have been greater). The selectivity, or the removal ratio between the composite metal layer and photoresist, using the $Cl_2$—$BCl_3$ chemistry, is only about 2 to 1. Therefore a thick photoresist shape is initially needed to insure the integrity of the photoresist shape, during the entire etch cycle. However the increased thickness of a masking photoresist shape, will adversely influence the ability to define narrow shapes in thicker photoresist layers.

Figure 4:
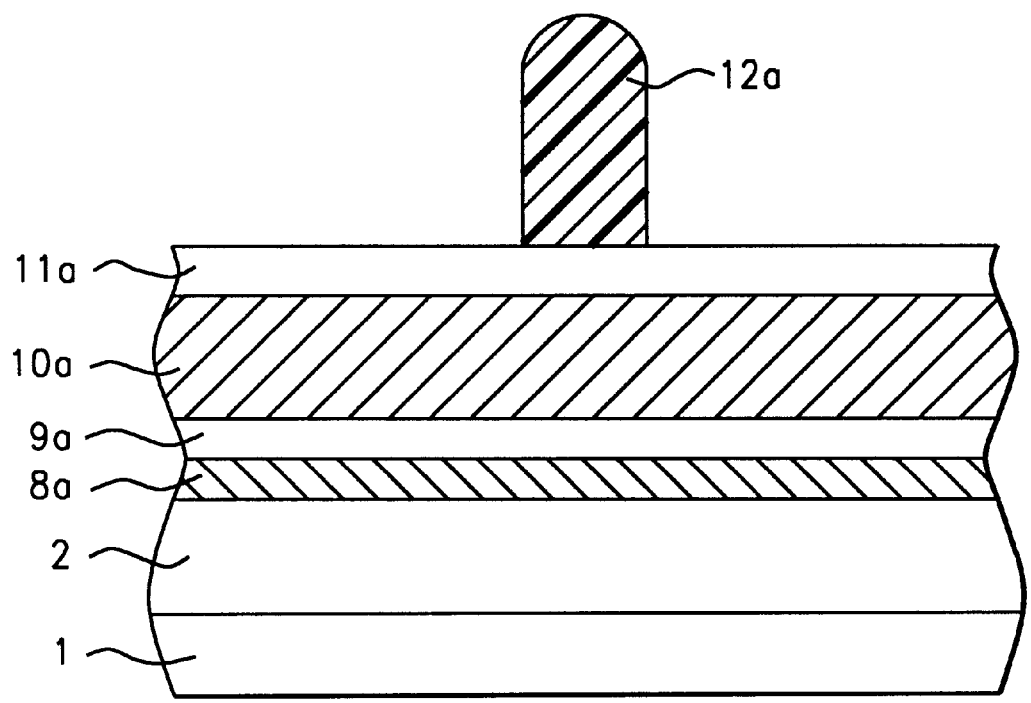
FIGS. 4–6, which schematically, in cross-sectional style, describe a procedure for plasma treating a photoresist shape, in a nitrogen containing ambient, then using the plasma treated photoresist shape as an etch mask, to define a pattern in a composite metal layer, featuring an aluminum based metal layer.
Figure 5:
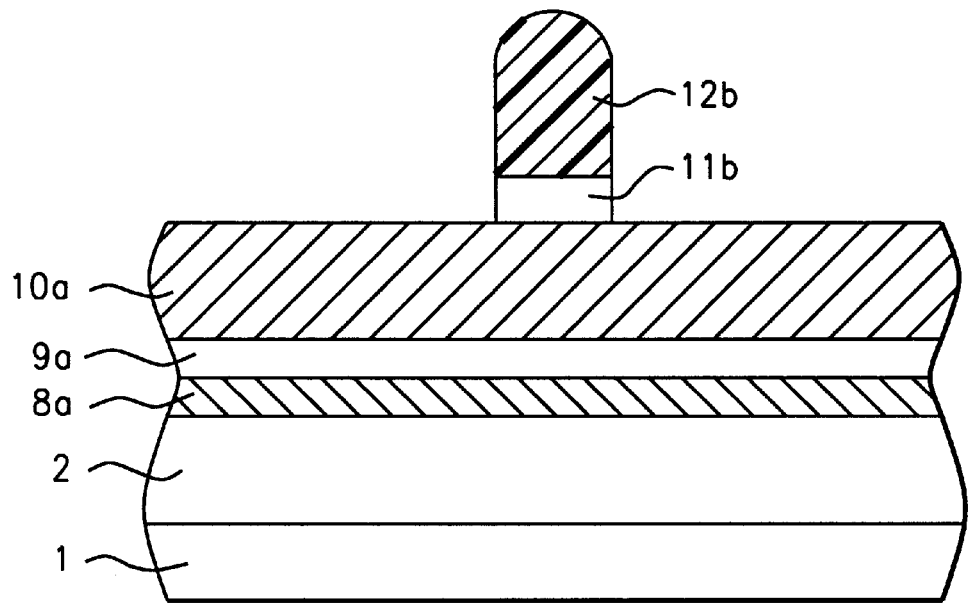
Figure 6:
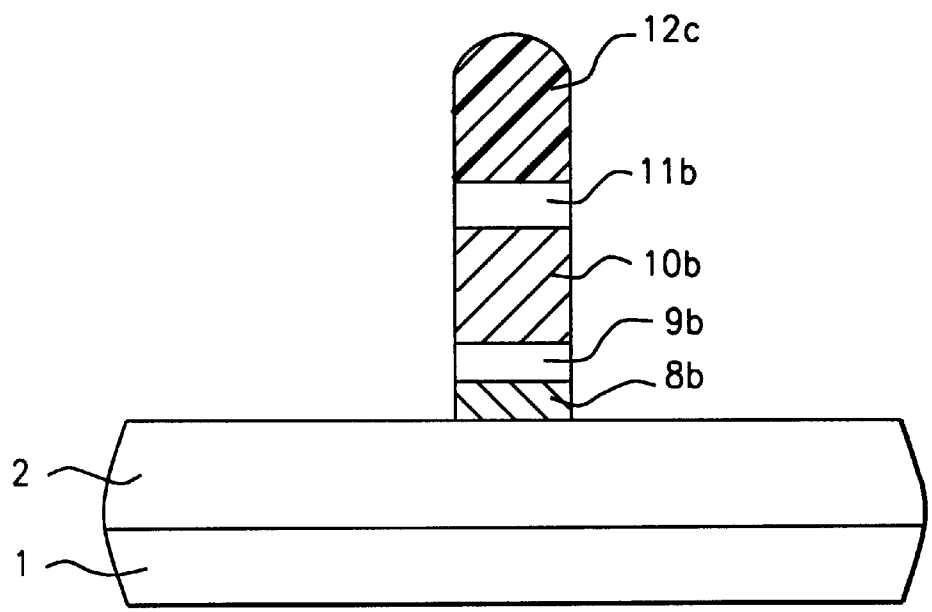

FIGS. 4–6, will describe a procedure used to increase the etch rate ratio between a composite metal layer and the masking photoresist shape, allowing a photoresist shape, comparable in thickness to photoresist shape 7a, used and described previously in FIGS. 1–3, to survive the entire etch cycle used to create a composite metal stack, featuring a aluminum based layer. FIG. 4, schematically shows photoresist shape 12a, at a thickness between about 6500 to 20000 Angstroms, and with a width between about 2000 to 5000 Angstroms, overlying a stack of metal layers comprised of: second titanium nitride layer 11a; aluminum based metal layer 10a; first titanium nitride layer 9a; and titanium layer 8a. These layers are identical in thickness, and obtained using the identical procedures, as counterparts previously described in FIGS. 1–3.

A first cycle of the RIE procedure is again performed, in a RIE system, using $Cl_2$—$BCl_3$ as an etchant, creating second titanium nitride shape 11b, underlying photoresist shape 12b, schematically shown in FIG. 5. Photoresist shape 12b, has been thinned during the first cycle of the RIE procedure, to a thickness between about 6000 to 15000 Angstroms. At this stage of the RIE procedure, an in situ, plasma treatment, is performed in a nitrogen containing ambient, resulting in a surface of photoresist shape 12b, that will be more resistant to the subsequent second cycle, or main etch cycle, of the RIE procedure. The plasma treatment is in situ performed in a nitrogen, or nitrogen containing ambient, at a pressure between about 10 to 14 mtorr, and at a power between about 400 to 500 watts, for a time between about 5 to 20 sec.

The main etch cycle is next performed, in situ, in the RIE system, using plasma treated, photoresist shape 12b, as an etch mask. The main etch cycle, or second cycle of the RIE procedure, again uses the $Cl_2$—$BCl_3$ chemistry to remove regions not protected by plasma treated, photoresist shape 12b, creating the desired composite metal stack comprised of: second titanium nitride shape 11b; aluminum base shape 10b; first titanium nitride shape 9b; and titanium shape 8b. However unlike the procedure previously described and illustrated in FIGS. 1–3, plasma treated photoresist shape 12c, schematically shown in FIG. 6, maintains a final thickness between about 1500 to 10000 Angstroms. The plasma treatment, applied to the photoresist shape 12b, in a nitrogen containing ambient, resulted in an etch rate ratio, or selectivity, between metal and photoresist of about 2.5 to 1. The increased etch rate ratio thus allows thinner photoresist shapes to be used, and thus allows narrow shapes to be formed in the thinner photoresist layers. The plasma treated photoresist shape 12c, is removed via plasma oxygen ashing.

This invention can also be applied to a metal interconnect structure, used to contact a conductive element that is located directly on an underlying insulator layer. In addition this invention can also be implemented using a silicon oxide layer, overlying the second titanium nitride, ARC layer. For this case in which a hard mask, such as silicon oxide, is used, a $CHF_3$ etchant would be used, in situ, in the RIE system, prior to the in situ plasma treatment of the photoresist shape.

A second iteration of this invention is to perform the plasma treatment, of the masking photoresist shape, in a nitrogen containing ambient, prior to the first etch cycle, used to define the second titanium nitride shape. The plasma treatment is performed to a photoresist shape, in a RIE system, followed by in situ RIE procedure, again using $Cl_2$—$BCl_3$ as an etchant, defining the complete composite metal stack, again comprised of the layers previously used in the first iteration of this invention, using the overlying, plasma treated, photoresist shape as a mask. The etch rate ratio, between metal and photoresist, again at a value of about 2.5 to 1, again allows the integrity, or the thickness of the starting photoresist shape, to survive the entire RIE procedure.

While this invention has been particularly shown and described with reference to, the preferred embodiments thereof, it will be understood by those skilled in the art that various changes in form and details may be made without departing from the scope and spirit of this invention.

What is claimed is:

1. A method for fabricating a metal interconnect structure, on a semiconductor substrate, comprising the steps of:
providing conductive elements in said semiconductor substrate;
providing an insulator layer on said semiconductor substrate, and providing an opening in said insulator layer, exposing a conductive element;
depositing an adhesive metal layer on the top surface of said insulator layer, and on said conductive element, located in the opening in said insulator layer;
depositing a barrier layer on said adhesive layer;
depositing a conductive metal layer on said barrier layer;
depositing an anti-reflective coating, (ARC), layer, on said conductive metal layer;
forming a photoresist shape on said ARC layer;
performing a first dry etching cycle, in a plasma etch system, removing regions of said ARC layer, not protected by said photoresist shape;
performing a plasma treatment to said photoresist shape, in a nitrogen containing ambient, in situ in said plasma etch system, creating a plasma treated photoresist shape;
performing a second dry etching cycle, in situ in said plasma etch system, removing: regions of said conductive metal layer; regions of said barrier layer; and regions of said adhesive metal layer, not protected by said plasma treated photoresist shape; and
removing said plasma treated photoresist shape, resulting in said metal interconnect structure comprised of: said ARC layer; said conductive metal layer; said barrier layer; and said adhesive layer.

2. The method of claim 1, wherein said adhesive layer, is a titanium layer, obtained via R.F. sputtering procedures, at a thickness between about 250 to 500 Angstroms.

3. The method of claim 1, wherein said barrier layer is a titanium nitride layer, obtained via R.F. sputtering procedures, at a thickness between about 250 to 1000 Angstroms.

4. The method of claim 1, wherein said conductive metal layer is an aluminum based layer, obtained via R.F. sputtering, to a thickness between about 3000 to 10000 Angstroms, and containing between about 0.5 to 1.0 weight percent copper.

5. The method of claim 1, wherein said ARC layer is a titanium nitride layer, obtained via R.F. sputtering, at a thickness between about 250 to 1000 Angstroms.

6. The method of claim 1, wherein said photoresist shape is between about 6500 to 20000 Angstroms, in thickness, and between about 2000 to 5000 Angstroms, in width.

7. The method of claim 1, wherein said first dry etching cycle, is performed in situ, in a RIE system, using $Cl_2$—$BCl_3$ as an etchant to remove regions of said ARC layer, not protected by said photoresist shape.

8. The method of claim 1, wherein said plasma treated photoresist shape, is obtained via in situ, plasma treatment, of said photoresist shape, in a RIE system, using said nitrogen containing ambient, such as nitrogen gas, at a pressure between about 10 to 14 mtorr, at a power between about 400 to 500 watts, and for a time between about 5 to 20 sec.

9. The method of claim 1, wherein said second dry etching cycle, performed in situ, in a RIE system, and used to remove: regions of said conductive metal layer; regions of said barrier layer; and regions of said adhesive layer; not protected by said plasma treated photoresist shape, is performed using $Cl_2$—$BCl_3$ as an etchant.

10. The method of claim 1, wherein the thickness of said plasma treated photoresist shape, at the conclusion of said second dry etching cycle, is between about 1500 to 10000 Angstroms.

11. The method of claim 1, wherein the etch rate ratio between said conductive metal layer, and said plasma treated photoresist shape is about 2.5 to 1.

12. A method of fabricating an aluminum based interconnect structure, on a semiconductor substrate, using a photoresist shape, plasma treated in a nitrogen containing ambient, as an etch mask, comprising the steps of:
depositing a titanium layer, on an underlying insulator layer, and on conductive regions, located either on said insulator layer, or exposed in openings in said insulator layer;
depositing a first titanium nitride layer, on said titanium layer;
depositing an aluminum based layer, on said first titanium nitride layer;
depositing a second titanium nitride layer, on said aluminum based layer;
forming a photoresist shape on said second titanium nitride layer;
performing a first RIE cycle, in a RIE system, removing the portion of said second titanium nitride layer, not covered by said photoresist shape;
performing an in situ, plasma treatment, of said photoresist shape, in said RIE system, in said nitrogen containing ambient, creating a plasma nitrogen treated, photoresist shape;
performing a second RIE cycle, in situ, in said RIE system, removing the portions of said aluminum based layer, the portions of said first titanium nitride layer, and the portion of said titanium layer, not covered by said plasma nitrogen treated, photoresist shape; and
removing said plasma nitrogen treated, photoresist shape, resulting in said aluminum based interconnect structure, comprised of: said second titanium nitride layer; said aluminum based layer; said first titanium nitride layer; and said titanium layer.

13. The method of claim 12, wherein said titanium layer is obtained via R.F, sputtering procedures, at a thickness between about 250 to 500 Angstroms.

14. The method of claim 12, wherein said first titanium nitride layer is obtained via R.F. sputtering procedures, at a thickness between about 250 to 1000 Angstroms.

15. The method of claim 12, wherein said aluminum based layer, is obtained via R.F. sputtering procedures, at a thickness between about 3000 to 10000 Angstroms, with said aluminum based layer containing between about 0.5 to 1.0 weight percent copper.

16. The method of claim 12, wherein said second titanium nitride layer is obtained via R.F. sputtering procedures, at a thickness between about 250 to 1000 Angstroms.

17. The method of claim 12, wherein said photoresist shape is formed at a thickness between about 6500 to 20000 Angstroms, and at a width between about 2000 to 5000 Angstroms.

18. The method of claim 12, wherein said first RIE cycle, used to remove exposed regions of said second titanium nitride layer, is performed using $Cl_2$—$BCl_3$ as an etchant.

19. The method of claim 12, wherein said plasma nitrogen treated, photoresist shape, is formed via an in situ plasma treatment, applied to said photoresist shape, in said RIE system, in a nitrogen ambient, at a pressure between about 10 to 14 mtorr, at a power between about 400 to 500 mtorr, and for a time between about 5 to 20 sec.

20. The method of claim 12, wherein said second RIE cycle, used to remove exposed regions of said aluminum based layer, of said first titanium nitride layer, and of said titanium layer, is performed, in situ, in said RIE system, using $Cl_2$—$BCl_3$ as an etchant.

21. The method of claim 12, wherein the thickness of said plasma nitrogen treated, photoresist shape, at the conclusion of said second RIE cycle, is between about 1500 to 10000 Angstroms.

22. The method of claim 12, wherein the etch rate ratio, between said aluminum based layer, and said plasma nitrogen treated, photoresist shape, is about 2.5 to 1.

23. A method of fabricating an aluminum based interconnect structure, on a semiconductor substrate, using a plasma treated photoresist shape, as an etch mask, comprising the steps of:

depositing a titanium layer, a first titanium nitride layer, an aluminum based layer, and a second titanium nitride layer, on an underlying insulator layer;

forming a photoresist shape, on the top surface of said second titanium nitride layer;

performing a plasma treatment, in a RIE system, in a nitrogen containing ambient, converting said photoresist shape, to a plasma nitrogen treated, photoresist shape;

performing a RIE cycle, in situ, in RIE system, removing regions of said second titanium nitride layer, regions of said aluminum based layer, regions of said first titanium nitride layer, and regions of said titanium layer, not protected by said plasma nitrogen treated, photoresist shape; and removing said plasma nitrogen treated, photoresist shape, resulting in said aluminum based interconnect structure, comprised of unetched regions: of said second titanium nitride layer; of said aluminum based layer; of said first titanium nitride layer; and of said titanium layer.

24. The method of claim 23, wherein said plasma nitrogen treated, photoresist shape, is obtained via plasma treatment of said photoresist shape, in said RIE system, in a nitrogen ambient, at a pressure between about 10 to 14 mtorr, at a power between about 400 to 500 watts, for a time between about 5 to 20 sec.

25. The method of claim 23, wherein said RIE cycle, used to pattern said aluminum based interconnect structure, is performed using $Cl_2$—$BCl_3$ as an etchant for said second titanium nitride layer, for said aluminum based layer, for said first titanium nitride layer, and for said titanium layer.

26. The method of claim 23, wherein the etch rate ratio between said aluminum based interconnect structure, and said plasma nitrogen treated, photoresist shape, is about 2.5 to 1.

* * * * *